United States Patent
Park et al.

(10) Patent No.: US 8,734,688 B2
(45) Date of Patent: *May 27, 2014

(54) COMPOUND SEMICONDUCTORS AND THEIR APPLICATION

(75) Inventors: Cheol-Hee Park, Daejeon (KR); Tae-Hoon Kim, Daejeon (KR)

(73) Assignee: LG Chem, Ltd., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 13/617,924

(22) Filed: Sep. 14, 2012

(65) Prior Publication Data

US 2013/0015413 A1 Jan. 17, 2013

Related U.S. Application Data

(63) Continuation of application No. PCT/KR2012/003734, filed on May 11, 2012.

(30) Foreign Application Priority Data

| | | |
|---|---|---|
| May 13, 2011 | (KR) | 10-2011-0045348 |
| May 13, 2011 | (KR) | 10-2011-0045349 |
| May 25, 2011 | (KR) | 10-2011-0049609 |
| May 11, 2012 | (KR) | 10-2012-0050262 |

(51) Int. Cl.
*H01B 1/02* (2006.01)

(52) U.S. Cl.
USPC ............ 252/519.14; 252/500; 252/501.1; 252/519.4; 252/62.3 T; 136/252

(58) Field of Classification Search
USPC ........................................... 252/500
See application file for complete search history.

(56) References Cited

U.S. PATENT DOCUMENTS 7,592,535 B2 * 9/2009 Kanatzidis et al. .......... 136/241
2010/0294326 A1 * 11/2010 Guo et al. .................... 136/238

FOREIGN PATENT DOCUMENTS

| KR | 10-2006-0125789 A | 12/2006 |
|---|---|---|
| KR | 10-2007-0015543 A | 2/2007 |
| KR | 10-20090026665 A | 3/2009 |
| KR | 10-2011-0016113 A | 2/2011 |
| KR | 10-2011-0016115 A | 2/2011 |

OTHER PUBLICATIONS

International Search Report from PCT/KR2012/003734 issue on Oct. 8, 2012, 2 pages.

* cited by examiner

*Primary Examiner* — Harold Pyon
*Assistant Examiner* — Katie L Hammer
(74) *Attorney, Agent, or Firm* — Rothwel, Figg, Ernst & Manbeck, P.C.

(57) ABSTRACT

Disclosed are new compound semiconductors which may be used for solar cells or as thermoelectric materials, and their application. The compound semiconductor may be represented by a chemical formula: $In_xM_yCo_{4-m-a}A_mSb_{12-n-z}X_nQ'_z$, where M is at least one selected from the group consisting of Ca, Sr, Ba, Ti, V, Cr, Mn, Cu, Zn, Ag, Cd, Sc, Y, La, Ce, Pr, Nd, Sm, Eu, Gd, Tb, Dy, Ho, Er, Tm, Yb and Lu; A is at least one selected from the group consisting of Fe, Ni, Ru, Rh, Pd, Ir and Pt; X is at least one selected from the group consisting of Si, Ga, Ge and Sn; Q' is at least one selected from the group consisting of O, S and Se; $0<x<1$; $0<y<1$; $0\leq m\leq 1$; $0\leq n<9$; $0<z\leq 2$ and $0<a\leq 1$.

11 Claims, 1 Drawing Sheet

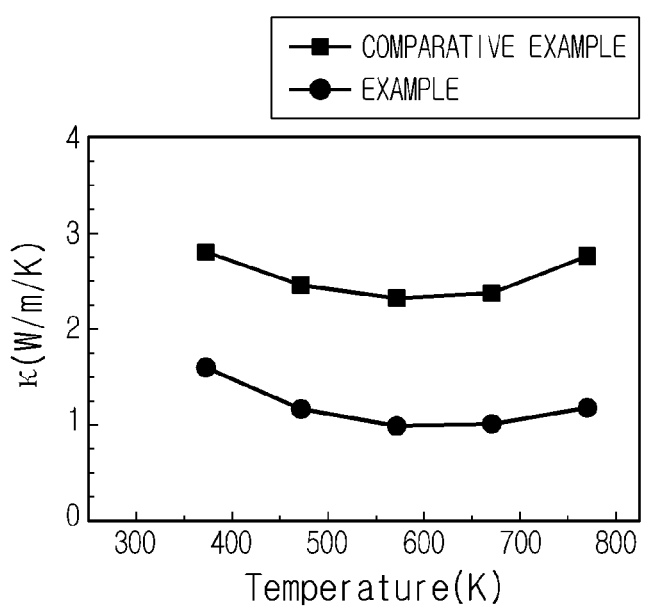

COMPOUND SEMICONDUCTORS AND THEIR APPLICATION

CROSS-REFERENCE TO RELATED APPLICATION

This application is a continuation of International Application No. PCT/KR2012/003734 filed on May 11, 2012, which claims priority to Korean Patent Application No. 10-2011-0045348 filed on May 13, 2011, Korean Patent Application No. 10-2011-0045349 filed on May 13, 2011, Korean Patent Application No. 10-2011-0049609 filed on May 25, 2011 and Korean Patent Application No. 10-2012-0050262 filed on May 11, 2012 in the Republic of Korea, the entire contents of which are incorporated herein by reference.

TECHNICAL FIELD

The present disclosure relates to a new compound semiconductor material which may be used for solar cells or as thermoelectric materials, its preparation method, and its applications.

BACKGROUND ART

A compound semiconductor is not a single element such as silicon and germanium but a compound having two or more kinds of combined elements serving as a semiconductor. Various kinds of compound semiconductors have been developed and used in many fields. For example, a compound semiconductor may be used for thermoelectric conversion devices using a Peltier effect, light emitting devices such as light emitting diodes and laser diodes using a photoelectric conversion effect, solar cells, or the like.

Among these, the thermoelectric conversion device may be applied to thermoelectric conversion generation, thermoelectric conversion cooling or the like. Here, in the thermoelectric conversion generation, a thermal electromotive force generated by applying a temperature difference to the thermoelectric conversion device is used for converting thermal energy to electric energy.

The energy conversion efficiency of the thermoelectric conversion device depends on ZT which is a performance index of the thermoelectric conversion material. Here, ZT is determined according to a Seebeck coefficient, electric conductivity, thermal conductivity, or the like. In more detail, ZT is proportional to the square of the Seebeck coefficient and the electric conductivity and is inversely proportional to the thermal conductivity. Therefore, in order to enhance the energy conversion efficiency of the thermoelectric conversion device, development of a thermoelectric conversion material with a high Seebeck coefficient, a high electric conductivity, or a low thermal conductivity is desired.

Meanwhile, a solar cell is environment-friendly since it does not need an energy source other than solar rays, and therefore are actively studied as an alternative future energy source. A solar cell may be generally classified as a silicon solar cell using a single element of silicon, a compound semiconductor solar cell using a compound semiconductor, and a tandem solar cell where at least two solar cells having different band gap energies are stacked.

Among these, a compound semiconductor solar cell uses a compound semiconductor in a light absorption layer which absorbs solar rays and generates an electron-hole pair, and may particularly use compound semiconductors in the III-V group such as GaAs, InP, GaAlAs and GaInAs, compound semiconductors in the II-VI group such as CdS, CdTe and ZnS, and compound semiconductors in the I-III-VI group represented by $CuInSe_2$.

The light absorption layer of the solar cell demands excellent long-term electric and optical stability, high photoelectric conversion efficiency, and easy control of the band gap energy or conductivity by composition change or doping. In addition, conditions such as production cost and yield should also be met for practical use. However, many conventional compound semiconductors fail to meet all of these conditions at once.

DISCLOSURE

Technical Problem

The present disclosure is designed to solve the problems of the prior art, and therefore it is an object of the present disclosure to provide a new compound semiconductor material, which may be utilized in various ways for thermoelectric conversion materials of thermoelectric conversion devices, solar cells or the like, a preparation method thereof, and a thermoelectric conversion device or solar cell using the same.

Other objects and advantages of the present disclosure will be understood from the following descriptions and become apparent by the embodiments of the present disclosure. In addition, it is understood that the objects and advantages of the present disclosure may be implemented by components defined in the appended claims or their combinations.

Technical Solution

In one aspect, after repeated studies of a compound semiconductor, inventors of the present disclosure have successfully synthesized a compound semiconductor represented by Chemical Formula 1, and found that this compound can be used for a thermoelectric conversion material of a thermoelectric conversion device or a light absorption layer of a solar cell.

$$In_xM_yCo_{4-m-a}A_mSb_{12-n-z}X_nQ'_z \quad \text{Chemical Formula 1}$$

In the Chemical Formula 1, M is at least one selected from the group consisting of Ca, Sr, Ba, Ti, V, Cr, Mn, Cu, Zn, Ag, Cd, Sc, Y, La, Ce, Pr, Nd, Sm, Eu, Gd, Tb, Dy, Ho, Er, Tm, Yb and Lu; and A is at least one selected from the group consisting of Fe, Ni, Ru, Rh, Pd, Ir and Pt; X is at least one selected from the group consisting of Si, Ga, Ge and Sn; Q' is at least one selected from the group consisting of O, S and Se; $0<x<1$; $0<y<1$; $0\le m\le 1$; $0\le n<9$; $0<z\le 2$ and $0<a\le 1$.

Preferably, in Chemical Formula 1, $0<x\le 0.25$.

Also preferably, in Chemical Formula 1, $0<x+y\le 1$.

Also preferably, in Chemical Formula 1, $0<n+z<9$.

In another aspect, the present disclosure also provides a preparation method of a compound semiconductor, which includes:

mixing In, Co and Sb as well as at least one selected from the group consisting of Ca, Sr, Ba, Ti, V, Cr, Mn, Cu, Zn, Ag, Cd, Sc, Y, La, Ce, Pr, Nd, Sm, Eu, Gd, Tb, Dy, Ho, Er, Tm, Yb, Lu and their oxides and at least one selected from the group consisting of O, S, Se and their oxides; and thermally treating the mixture formed in the mixing step.

Preferably, the mixture formed in the mixing step further contains at least one selected from the group consisting of Fe, Ni, Ru, Rh, Pd, Ir, Pt and their oxides.

Also preferably, the mixture formed in the mixing step further contains at least one selected from the group consisting of Si, Ga, Ge, Sn and their oxides.

Also preferably, the thermally treating step is performed at 400° C. to 800° C.

Also preferably, the thermally treating step includes at least two thermal treatment stages.

In another aspect, the present disclosure also provides a thermoelectric conversion device, which includes the compound semiconductor as above.

In another aspect, the present disclosure also provides a solar cell, which includes the compound semiconductor as above.

Advantageous Effects

According to the present disclosure, a new compound semiconductor material is provided.

In one aspect, the new compound semiconductor may replace a conventional compound semiconductor or may be used as another material in addition to the conventional compound semiconductor.

Further, in one aspect of the present disclosure, since the compound semiconductor has good thermoelectric conversion performance, it may be used for a thermoelectric conversion device. In particular, the compound semiconductor according to the present disclosure may have an improved ZT value, which is a thermoelectric performance index, since the thermal conductivity is improved. Therefore, the compound semiconductor according to the present disclosure may be used as a thermoelectric conversion material of a thermoelectric conversion device.

In addition, in another aspect of the present disclosure, the compound semiconductor may be used for a solar cell. Particularly, the compound semiconductor of the present disclosure may be used as a light absorption layer of the solar cell.

Moreover, in another aspect of the present disclosure, the compound semiconductor may be used for an IR window or IR sensor which selectively passes IR, a magnetic device, a memory or the like.

DESCRIPTION OF DRAWINGS

Other objects and aspects of the present disclosure will become apparent from the following descriptions of the embodiments with reference to the accompanying drawing in which:

FIG. 1 is a graph showing thermal conductivity values according to a temperature change of compound semiconductors according to an example according to the present disclosure and a comparative example.

PREFERRED EMBODIMENTS

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure based on the principle that the inventor is allowed to define terms.

Therefore, the description proposed herein is just a preferable example for the purpose of illustration only, and is not intended to limit the scope of the disclosure, so it should be understood that other equivalents and modifications could be made thereto without departing from the spirit and scope of the disclosure.

The present disclosure provides a new compound semiconductor represented by Chemical Formula 1 below.

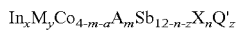   Chemical Formula 1

$In_xM_yCo_{4-m-a}A_mSb_{12-n-z}X_nQ'_z$

In the Chemical Formula 1, M is at least one selected from the group consisting of Ca, Sr, Ba, Ti, V, Cr, Mn, Cu, Zn, Ag, Cd, Sc, Y, La, Ce, Pr, Nd, Sm, Eu, Gd, Tb, Dy, Ho, Er, Tm, Yb and Lu; and A is at least one selected from the group consisting of Fe, Ni, Ru, Rh, Pd, Ir and Pt; X is at least one selected from the group consisting of Si, Ga, Ge and Sn; and Q' is at least one selected from the group consisting of O, S and Se.

In addition, in the Chemical Formula 1, $0<x<1$, $0<y<1$, $0\leq m\leq 1$, $0\leq n<9$, $0<z\leq 2$ and $0<a\leq 1$.

Preferably, in Chemical Formula 1, $0<x\leq 0.25$.
Also preferably, in Chemical Formula 1, $0<x+y\leq 1$.
Also preferably, in Chemical Formula 1, $0\leq m\leq 0.5$.
Also preferably, in Chemical Formula 1, $0<n+z<9$.
More preferably, in Chemical Formula 1, $0<n+z<5$.
Most preferably, in Chemical Formula 1, $0<n+z<3$.
Also preferably, in Chemical Formula 1, $0<a\leq 0.5$.

Meanwhile, the compound semiconductor represented by Chemical Formula 1 may include a secondary phase partially, and the amount of the secondary phase may vary depending on a thermal treatment condition.

The above compound semiconductor may be prepared by forming a mixture containing In, Co and Sb as well as at least one selected from the group consisting of Ca, Sr, Ba, Ti, V, Cr, Mn, Cu, Zn, Ag, Cd, Sc, Y, La, Ce, Pr, Nd, Sm, Eu, Gd, Tb, Dy, Ho, Er, Tm, Yb, Lu and their oxides and at least one selected from the group consisting of O, S, Se and their oxides; and thermally treating the mixture.

Preferably, in the mixture forming step, the mixture may further contain at least one selected from the group consisting of Fe, Ni, Ru, Rh, Pd, Ir, Pt and their oxides.

Also preferably, in the mixture forming step, the mixture may further contain at least one selected from the group consisting of Si, Ga, Ge, Sn and their oxides.

Meanwhile, each material used in the mixture forming step may be in a powder form, but the present disclosure is not limited to a specific form of the material.

Also preferably, the thermally treating step may be performed in vacuum or in a gas such as Ar, He and $N_2$, partially containing hydrogen or not containing hydrogen.

At this time, the thermally treating temperature may be 400° C. to 800° C. Preferably, the thermally treating temperature may be 450° C. to 700° C. More preferably, the thermally treating temperature may be 500° C. to 650° C.

Meanwhile, the thermally treating step may include at least two thermal treatment stages. For example, a first thermal treatment may be performed at a first temperature to the mixture obtained in the mixture forming step, namely in the step of mixing materials, and a second thermal treatment may be performed thereto at a second temperature.

Here, some of the thermal treatment stages may be performed during the mixture forming step where materials are mixed is executed.

For example, the thermally treating step may include three thermal treatment stages composed of a first thermal treatment stage, a second thermal treatment stage and a third thermal treatment (sintering) stage. In addition, the first thermal treatment stage may be performed in a temperature range of 400° C. to 600° C., and the second and third thermal treatment stages may be performed in a temperature range of 600° C. to 800° C. The first thermal treatment stage may be performed during the mixture forming step, and the second and third thermal treatment stages may be performed in order after the mixture forming step.

A thermoelectric conversion device according to the present disclosure may include the compound semiconductor described above. In other words, the compound semiconductor according to the present disclosure may be used as a thermoelectric conversion material for the thermoelectric conversion device. Particularly, the compound semiconductor according to the present disclosure has a large ZT value, which is a performance index of the thermoelectric conversion material. In addition, due to low thermal conductivity, a high Seebeck coefficient and high electric conductivity, the compound semiconductor has excellent thermoelectric conversion performance. Therefore, the compound semiconductor according to the present disclosure may replace a conventional thermoelectric conversion material or may be used for a thermoelectric conversion device in addition to the conventional compound semiconductor.

In addition, a solar cell according to the present disclosure may include the compound semiconductor above. In other words, the compound semiconductor according to the present disclosure may be used for a solar cell, particularly as a light absorption layer of the solar cell.

The solar cell may be produced in a structure where a front surface transparent electrode, a buffer layer, a light absorption layer, a rear surface electrode and a substrate are laminated in order from the side where a solar ray is incident. The substrate located at the lowest portion may be made of glass, and the rear surface electrode on the entire surface thereof may be formed by depositing metal such as Mo.

Subsequently, the compound semiconductor according to the present disclosure may be laminated on the rear surface electrode by means of an electron beam deposition method, a sol-gel method, or a PLD (Pulsed Laser Deposition) to form the light absorption layer. On the light absorption layer, a buffer layer for buffering the difference in lattice constants and band gaps between a ZnO layer serving as the front surface transparent electrode and the light absorption layer may be present. The buffer layer may be formed by depositing a material such as CdS by means of CBD (Chemical Bath Deposition) or the like. Next, the front surface transparent electrode may be formed on the buffer layer by means of sputtering or the like as a ZnO film or a ZnO and ITO laminate.

The solar cell according to the present disclosure may be modified in various ways. For example, it is possible to manufacture a tandem solar cell where a solar cell using the compound semiconductor according to the present disclosure as the light absorption layer is laminated. In addition, the solar cell laminated as described above may employ a solar cell using silicon or another known compound semiconductor.

In addition, it is possible to change a band gap of the compound semiconductor according to the present disclosure and laminate a plurality of solar cells which use compound semiconductors having different band gaps as the light absorption layer. The band gap of the compound semiconductor according to the present disclosure may be adjusted by changing a composition ratio of a component of the compound, particularly Te.

In addition, the compound semiconductor according to the present disclosure may also be applied to IR windows or IR sensors which selectively pass IR.

EXAMPLES

Hereinafter, embodiments of the present disclosure will be described in detail. The embodiments of the present disclosure, however, may take several other forms, and the scope of the present disclosure should not be construed as being limited to the following examples. The embodiments of the present disclosure are provided to more fully explain the present disclosure to those having ordinary knowledge in the art to which the present disclosure pertains.

Example 0.0502 g of In, 0.0114 g of Zn, 0.3708 g of Co, 0.0540 g of Rh, 2.3409 g of Sb, 0.1037 g of Sn and 0.0690 g of Se were prepared as reagents, and were mixed by using mortar. The materials mixed as above were put into a silica tube and vacuum-sealed and then heated at 650° C. for 36 hours. The time for raising the temperature to 650° C. was 1 hour and 30 minutes, and $In_{0.25}Zn_{0.1}Co_{3.6}Rh_{0.3}Sb_{11}Sn_{0.5}Se_{0.5}$ powder was obtained.

A part of the composed materials prepared above was formed into a disk having a diameter of 10 mm and a thickness of 1 mm. After that, a pressure of 200 MPa was applied thereto by using a CIP (Cold Isostatic Pressing). Subsequently, the obtained result was put into a quartz tube and vacuum-sintered for 12 hours. In regard to the sintered disk, thermal conductivity was measured by using LFA457 (Netzsch, Inc) at predetermined temperature intervals. The measurement result is shown in FIG. 1 as Example.

Comparative Example

In, Co and Sb were prepared as reagents, and were mixed by using mortar to make a mixture having compositions of $In_{0.25}Co_4Sb_{12}$ in a pellet form. The mixture was heated at 500° C. for 15 hours under $H_2$ (1.94%) and $N_2$ gas. The time for raising the temperature to 500° C. was 1 hour and 30 minutes.

The materials mixed as above were put in a silica tube and vacuumsealed, and then were heated at 650° C. for 36 hours. The time for raising the temperature to 650° C. was 1 hour and 30 minutes, and $In_{0.25}Co_4Sb_{12}$ powder was obtained.

A part of the material prepared above was formed into a disk having a diameter of 10 mm and a thickness of 1 mm. After that, a pressure of 200 MPa was applied thereto by using a CIP. Subsequently, the obtained result was put into a quartz tube and vacuum-sintered for 12 hours. In regard to the sintered disk, thermal conductivity ($\kappa$) was measured by using LFA457 (Netzsch, Inc). The measurement result is shown in FIG. 1 as Comparative Example.

Referring to the results shown in FIG. 1, it could be found that the compound semiconductor according to the Example of the present disclosure expressed by $In_{0.25}Zn_{0.1}Co_{3.6}Rh_{0.3}Sb_{11}Sn_{0.5}Se_{0.5}$ has very low thermal conductivity ($\kappa$) over the entire temperature measurement region in comparison to the compound semiconductor according to the Comparative Example expressed by $In_{0.25}Co_4Sb_{12}$.

In addition, the ZT value which is a thermoelectric performance index can be expressed as follows:

$$ZT=\sigma S^2 T/\kappa$$

Here, $\sigma$ represents electric conductivity, S represents a Seebeck coefficient, T represents temperature, and $\kappa$ represents thermal conductivity The compound semiconductor according to the present disclosure may have an improved ZT value since the thermal conductivity is low. Therefore, the compound semiconductor according to the present disclosure may be regarded as having excellent thermoelectric conversion and so can be very useful as a thermoelectric conversion material.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. A compound semiconductor, represented by Chemical Formula 1 below:

$$In_xM_yCo_{4-m-a}A_mSB_{12-n-z}X_nQ'_z \qquad \text{Chemical Formula 1}$$

where, in the Chemical Formula 1, M is either Zn or Zn and at least one selected from the group consisting of Ca, Sr, Ba, Ti, V, Cr, Mn, Cu, Ag, Cd, Sc, Y, La, Ce, Pr, Nd, Sm, Eu, Gd, Tb, Dy, Ho, Er, Tm, Yb and Lu; A is at least one selected from the group consisting of Fe, Ni, Ru, Rh, Pd, Ir and Pt; X is at least one selected from the group consisting of Si, Ga, Ge and Sn; Q' is at least one selected from the group consisting of O, S and Se; $0<x<1$; $0<y<1$; $0\le m\le 1$; $0\le n<9$; $0<z\le 2$ and $0<a\le 1$.

2. The compound semiconductor according to claim 1, wherein, in Chemical Formula 1, $0<x\le 0.25$.

3. The compound semiconductor according to claim 1, wherein, in Chemical Formula 1, $0<x+y\le 1$.

4. The compound semiconductor according to claim 1, wherein, in Chemical Formula 1, $0<n+z<9$.

5. A preparation method of a compound semiconductor, comprising:

forming a mixture containing In, Co and Sb as well as at least one selected from the group consisting of Ca, Sr, Ba, Ti, V, Cr, Mn, Cu, Zn, Ag, Cd, Sc, Y, La, Ce, Pr, Nd, Sm, Eu, Gd, Tb, Dy, Ho, Er, Tm, Yb, Lu and their oxides and at least one selected from the group consisting of O, S, Se and their oxides; and thermally treating the mixture, thereby preparing the compound semiconductor defined in claim 1.

6. The preparation method of a compound semiconductor according to claim 5, wherein the mixture further contains at least one selected from the group consisting of Fe, Ni, Ru, Rh, Pd, Ir, Pt and their oxides.

7. The preparation method of a compound semiconductor according to claim 5, wherein the mixture further contains at least one selected from the group consisting of Si, Ga, Ge, Sn and their oxides.

8. The preparation method of a compound semiconductor according to claim 5, wherein the thermally treating step is performed at 400° C. to 800° C.

9. The preparation method of a compound semiconductor according to claim 5, wherein the thermally treating step includes at least two thermal treatment stages.

10. A thermoelectric conversion device, which includes the compound semiconductor defined in claim 1.

11. A solar cell, which includes the compound semiconductor defined in claim 1.

* * * * *